(12) United States Patent
Iwai et al.

(10) Patent No.: US 7,833,347 B2
(45) Date of Patent: Nov. 16, 2010

(54) PROCESS AND APPARATUS FOR PRODUCING NITRIDE SINGLE CRYSTAL

(75) Inventors: Makoto Iwai, Kasugai (JP); Shuhei Higashihara, Nagoya (JP); Takatomo Sasaki, Suita (JP); Yusuke Mori, Suita (JP); Fumio Kawamura, Suita (JP)

(73) Assignees: NGK Insulators, Ltd., Nagoya (JP); Osaka University, Suita (JP)

(*) Notice: Subject to any disclaimer, the term of this patent is extended or adjusted under 35 U.S.C. 154(b) by 12 days.

(21) Appl. No.: 12/212,722

(22) Filed: Sep. 18, 2008

(65) Prior Publication Data
US 2009/0013924 A1    Jan. 15, 2009

Related U.S. Application Data

(63) Continuation of application No. PCT/JP2007/054738, filed on Mar. 5, 2007.

(30) Foreign Application Priority Data
Mar. 23, 2006    (JP) .............................. 2006-080526

(51) Int. Cl.
C30B 11/00    (2006.01)
C30B 7/00    (2006.01)
(52) U.S. Cl. ............................. 117/73; 117/71; 117/79
(58) Field of Classification Search .................. 117/71, 117/73, 79, 200–220
See application file for complete search history.

(56) References Cited

U.S. PATENT DOCUMENTS

| 4,668,481 | A | * | 5/1987 | Watanabe et al. ........... 117/216 |
|---|---|---|---|---|
| 5,941,297 | A | * | 8/1999 | Young ........................... 164/62 |
| 6,103,182 | A | * | 8/2000 | Campbell ..................... 266/45 |
| 6,273,948 | B1 | * | 8/2001 | Porowski et al. ............... 117/77 |
| 6,790,254 | B1 | * | 9/2004 | Feichtinger et al. ........... 75/379 |
| 2003/0164138 | A1 | | 9/2003 | Sarayama et al. |
| 2005/0098090 | A1 | | 5/2005 | Hirota et al. |
| 2007/0209575 | A1 | | 9/2007 | Iwai et al. |
| 2008/0193363 | A1 | * | 8/2008 | Tsuji ........................... 423/409 |
| 2009/0000542 | A1 | * | 1/2009 | Iwai et al. ................... 117/206 |

FOREIGN PATENT DOCUMENTS

| JP | 09-117660 A1 | 5/1997 |
|---|---|---|
| JP | 2002-293696 A1 | 10/2002 |
| JP | 2003-292400 A1 | 10/2003 |
| JP | 2005-154254 A1 | 6/2005 |

(Continued)

OTHER PUBLICATIONS

U.S. Appl. No. 12/181,402, filed Jul. 29, 2008, Iwai et al.
U.S. Appl. No. 12/190,230, filed Aug. 12, 2008, Iwai et al.
U.S. Appl. No. 12/192,428, filed Aug. 15, 2008, Iwai et al.

(Continued)

Primary Examiner—Robert M Kunemund
Assistant Examiner—G. Nagesh Rao
(74) Attorney, Agent, or Firm—Burr & Brown

(57) ABSTRACT

A nitride single crystal is produced using a growth solution containing an easily oxidizable material. A crucible for storing the growth solution, a pressure vessel for storing the crucible and charging an atmosphere containing at least nitrogen, and an oxygen absorber disposed inside the pressure vessel and outside the crucible are used to grow the nitride single crystal.

2 Claims, 3 Drawing Sheets

FOREIGN PATENT DOCUMENTS

| | | |
|---|---|---|
| JP | 2005-263622 A1 | 9/2005 |
| WO | 2005/080648 A1 | 9/2005 |
| WO | WO 2005/095682 A1 | 10/2005 |
| WO | 2006/019098 A1 | 2/2006 |
| WO | 2006/098458 A1 | 9/2006 |
| WO | WO 2006095536 * | 9/2006 |
| WO | WO 2007122949 A1 * | 11/2007 |
| WO | WO 2009081687 * | 7/2009 |

OTHER PUBLICATIONS

U.S. Appl. No. 12/234,786, filed Sep. 22, 2008, Imai et al.
U.S. Appl. No. 12/234,799, filed Sep. 22, 2008, Imai et al.
U.S. Appl. No. 12/284,470, filed Sep. 22, 2008, Ichimura et al.
Kawamura et al., "*Growth of Large/Low-Dislocation GaN Single Crystal by LPE Growth,*" Journal of Japanese Association for Crystal Growth, vol. 32, No. 1, 2005, pp. 3-9.

* cited by examiner

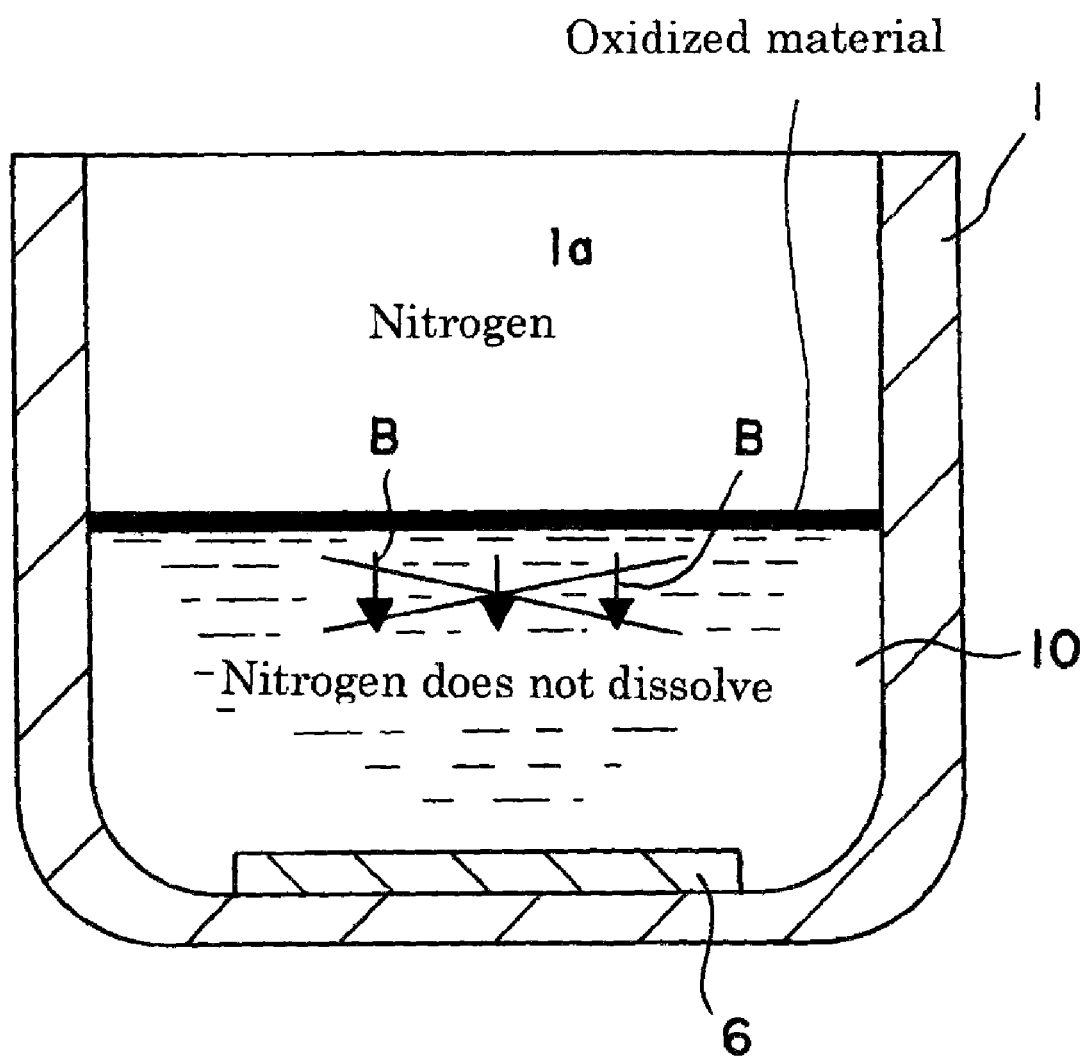

PROCESS AND APPARATUS FOR PRODUCING NITRIDE SINGLE CRYSTAL

CROSS-REFERENCE RELATED APPLICATIONS

This application Ser. No. 12/212,722 is a continuation of PCT/JP 2007/054738, filed on Mar. 5, 2007 which claims foreign priority to Japan 2006-080526 filed Mar. 23, 2006.

FIELD OF THE INVENTION

The present invention relates to a method and apparatus for producing a nitride single crystal by a so-called flux method using Na or the like.

BACKGROUND OF THE INVENTION

Gallium nitride-based III-V nitride, which is attracting attention as an excellent blue light emitting element, is put into practical use in light emitting diode field, and expected also as an optical pickup blue-violet semiconductor laser element. In a process for growing a gallium nitride single crystal by Na flux method, mixed gas of nitrogen and ammonia is used with an atmospheric pressure of 10 to 100 atms, for example, in Japanese Patent Publication (Laid-Open) No. 2002-293696A. In also Japanese Patent Publication (Laid-Open) No. 2003-292400A, the atmospheric pressure during the growth is 100 atm or less, with 2, 3 and 5 MPa (about 20 atm, 30 atm and 50 atm) being used in working examples thereof.

On the other hand, the present inventors disclosed a method for efficiently growing a gallium nitride single crystal under a specific condition by use of a hot isostatic pressing (HIP) apparatus in Japanese Patent Application No. 2004-103093 (WO2005/095682 A1).

In "Growth of Large/Low-Dislocation GaN Single Crystal by LPE Growth" by Kawamura et al. of "Journal of Japanese Association for Crystal Growth" Vol. 32, No. 1, 2005, it is described that when a GaN single crystal is grown by Na flux method, the GaN single crystal is liable to black due to existence of nitrogen defects.

SUMMARY OF THE INVENTION

Crystal growth by flux methods using heating and pressurizing apparatuses involve the following problems. That is, in conventional growth when using a muffle furnace, it is easy to prevent oxidation of raw materials by atmospheric oxygen since operations of weighing the raw materials, charging them into a crucible, and hermetically sealing the crucible in a stainless hermetic container with valve are performed within a glove box without exposing the raw materials to the atmosphere, and the hermetic container is thereafter taken out of the glove box. However, the hermetic container with valve cannot be used within the HIP apparatus. Since a lid of a pressure-resistant container of the HIP apparatus is opened, and closed after the crucible is directly disposed within the container, the raw materials may be exposed to the atmosphere and oxidized during the operation.

As a result, dissolution of nitrogen at the liquid-gas interface of a growth solution is inhibited to reduce the nitriding rate of gallium, and resulting gallium nitride single crystals are blackened.

The present inventors further disclosed in Japanese Patent Application No. 2005-70649 (WO 2006/098458) to airtightly seal an opening part of a container which contains a raw material such as Na flux, and lay the opening part in an open state by melting a sealant in heating and pressurizing treatment to thereby allow the inside of the container to communicate with the external non-oxidizing atmosphere.

When the crystal growth by the flux method is performed using the HIP apparatus, structural members such as a heater, a heat insulating material (furnace material) and a movable mechanism must be stored within a pressure vessel. In a high-temperature and high-pressure area as described above, however, oxidation of a growth solution is caused by oxygen and moisture diffused from the furnace material, the heater and the like during the growth. This causes coloring of crystals, which brings about an uneven experimental results.

An object of the present invention is to prevent deterioration of nitride single crystal due to oxidation of a growth solution in growth of the nitride single crystal by flux method.

The present invention provides a method for growing a nitride single crystal using a growth solution comprising an easily oxidizable material, wherein:

a crucible for storing the growth solution, a pressure vessel for storing the crucible and charging an atmosphere containing at least nitrogen gas, and an oxygen absorber disposed inside the pressure vessel and outside the crucible are used to grow the nitride single crystal.

The present invention further provides an apparatus for growing a nitride single crystal using a growth solution containing an easily oxidizable material, the apparatus comprising:

a crucible for storing the growth solution;

a pressure vessel for storing the crucible and charging an atmosphere containing at least nitrogen gas; and an oxygen absorber disposed inside the pressure vessel and outside the crucible.

The present inventors have successfully prevented the coloring of crystals due to oxidation of a growth solution resulting from a structural member such as a heater, a heat insulating material (furnace material) or a movable mechanism within a pressure vessel, by disposing an oxygen absorber within the pressure vessel based on the above-mentioned finding.

BRIEF DESCRIPTION OF THE DRAWINGS

FIG. 3 is a schematic sectional view of the crucible 1 illustrating growth of a single crystal in an oxidized growth solution.

DETAILED DESCRIPTION OF THE INVENTION

In a preferred embodiment, a crucible containing a growth solution is placed within a pressure vessel, and heated under high pressure by use of a hot isostatic pressing apparatus. At that time, atmospheric gas containing nitrogen is supplied into the pressure vessel while compressing it to a predetermined pressure to control the total pressure and nitrogen partial pressure within the pressure vessel.

In a preferred embodiment, an outer container for storing the crucible is provided within the pressure vessel, and an oxygen absorber is provided within the outer container. According to this structure, members susceptible to corrosion, such as a heater and a heat insulating material, can be set further outside the outer container, and contact of oxygen generated from such members with the growth solution can be further advantageously prevented.

In a preferred embodiment, the oxygen absorber may be provided also outside the outer container.

Figure 1:
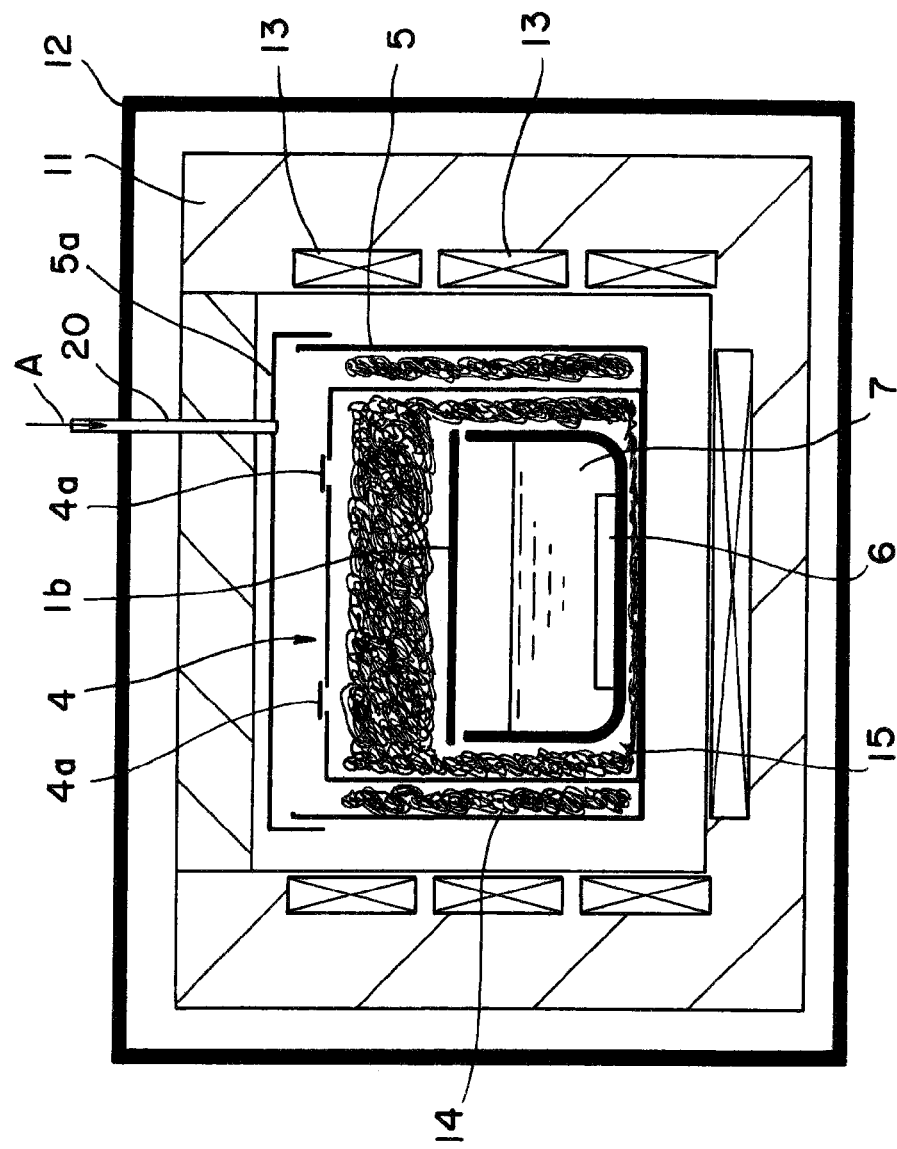
FIG. 1 is a schematic view of a growth apparatus for carrying out the present invention.

FIG. 1 schematically shows an apparatus for carrying out the present invention. A furnace material 11 is provided within a pressure vessel 12, and a predetermined heater 13 is provided within the furnace material 11. An atmospheric control container 5 is placed inside the furnace material 11, and an outer container 4 is placed inside the container 5. A crucible 1 is placed further inside the outer container 4.

The crucible 1 is provided with a lid 1b, a growth solution 7 is produced within the crucible 1, and a seed crystal 6 is immersed therein. The outside of the crucible 1 and the inside of the outer container 4 are filled with an oxygen absorber 15. Lids 4a of the outer container 4 are melted and extinguished at the time of heating before starting the growth, and the parts of the lids 4a are opened. An oxygen absorber 14 is also disposed outside the outer container 4 and inside the atmospheric control container 5.

A mixed gas cylinder not shown is provided outside the pressure vessel 12. The mixed gas cylinder is filled with mixed gas having a predetermined composition, and the mixed gas is compressed to a predetermined pressure by a compressor, and supplied into the pressure vessel 12 through a supply pipe 20 as shown by arrow A. Of this atmosphere, nitrogen is used as a nitrogen source, and inert gas such as argon gas suppresses vaporization of flux such as sodium. The pressure of the atmosphere is monitored by a pressure gauge not shown.

Figure 2:
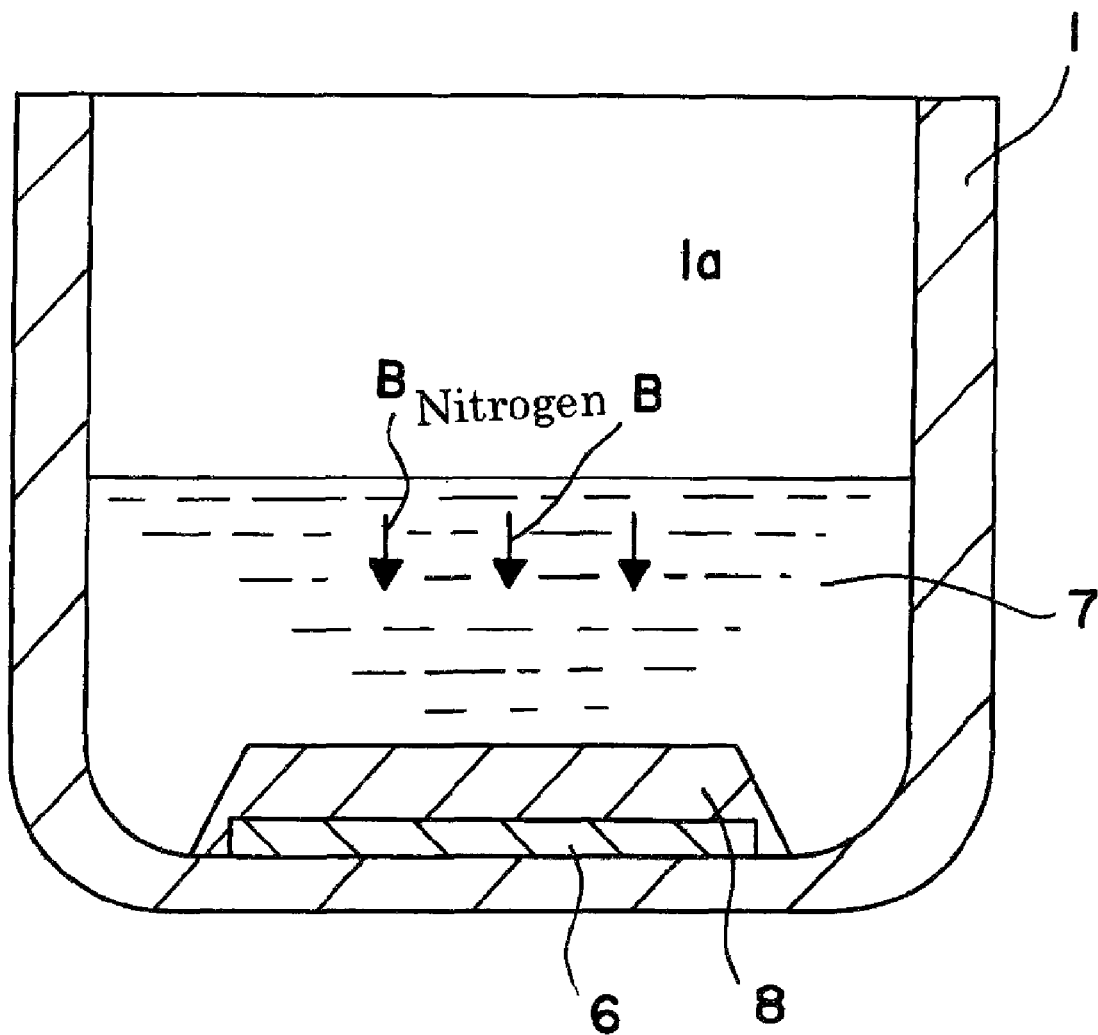
FIG. 2 is a schematic sectional view of a crucible 1, in which a single crystal 8 is grown.

When the crucible 1 is heated and pressurized within the pressure vessel 12, mixed raw materials are entirely melted within the crucible 1 to produce a growth solution 7, as shown in FIG. 2. When a predetermined single crystal growth condition is retained then, a single crystal film 8 is grown over the seed crystal 6 with stable supply of nitrogen from an inner space 1a into the growth solution 7.

According to the present invention, oxygen generated from the furnace material 11, the heater 13 or the like is absorbed by the oxygen absorbers 14 and 15, hardly reaching the growth solution 7. Therefore, the coloring of crystals due to oxidation of the growth solution, intake of oxygen, or the like can be prevented.

When the easily oxidizable material e.g. sodium metal is oxidized, the oxidized raw materials gather in the vicinity of the liquid-gas interface of a growth solution 10 to obstruct dissolution of nitrogen to the growth solution as shown by arrow B in FIG. 3, for example. Therefore, the nitrogen cannot be satisfactorily supplied into the growth solution. Consequently a single crystal film of good quality cannot be formed on the seed crystal 6 with good productivity or a problem such as coloring can be caused in the resulting single crystal.

The oxygen absorber may be formed of any material which can absorb oxygen during the reaction without particular limitation; examples thereof include iron, copper, zeolite, and molecular sieve. Alternatively a coating of such material with high oxygen absorbing performance as described above can be applied onto only a surface layer of the oxygen absorber. This coating can be performed by use of an optional method such as plating or vapor deposition without particular limitation.

Although the form of the oxygen absorber is not particularly limited, the oxygen absorber preferably has a larger surface area since higher oxygen absorbing efficiency can be ensured. From this point of view, the oxygen absorber preferably has a porous form such as flocculent form (wooly form), felt form or sponge form, a powdered form, a granulated form or the like.

Further, the material of the oxygen absorber has to withstand a use in the high-temperature and high-pressure growing environment. In a particularly preferred embodiment, the oxygen absorber is composed of wool at least the surface of which is composed of the above-mentioned metal with high oxygen absorbing performance. In this case, the wool may be entirely composed of the metal with high oxygen absorbing performance, or only the surface of the wool may be composed of the metal with high oxygen absorbing performance.

The specific surface area of the oxygen absorber is preferably $1000$ $cm^2/g$ or more, further preferably $1$ $m^2/g$ or more. A particularly preferred oxygen absorber is steel wool, copper wool, copper-plated steel wool, or nickel-plated steel wool. As an example of the steel wool, "Bon Star No. 0000" by Nihon Steel Wool Co., Ltd. can be given.

In the present invention, the kind of the non-oxidizing atmosphere is not particularly limited and, for example, an inert gas atmosphere of nitrogen, argon or the like and a reductive atmosphere of carbon monoxide, hydrogen or the like are adaptable. The present invention is particularly suitable to a nitrogen-containing atmosphere. The nitrogen-containing atmosphere may contain non-oxidizing gas other than nitrogen, for example, inert gas such as argon or reductive gas, although it may be composed of only nitrogen.

In the present invention, the raw material mixture can be weighed, for example, by use of a glove box. The hermetic container used for heating and melting all or a part of the weighed raw material mixture is not particularly limited. The inside of the hermetic container is retained in the above-mentioned non-oxidizing atmosphere. The pressure of this atmosphere is not particularly limited, but can be set to, for example, 0.2 kPa to 0.1 MPa (gauge pressure).

In the present invention, the device for heating the raw material mixture to produce the growth solution in the single crystal growth apparatus is not particularly limited. A hot isostatic pressing apparatus is preferred as such device, but other atmospheric pressure type heating furnaces are also usable.

The easily oxidizable material to which the present invention is applicable is not particularly limited. The easily oxidizable material means a material for which oxidization is easily observed when it contacts with the atmosphere at ordinary temperature, for example, a material such that the oxidization is observed within 1 minute. The easily oxidizable material may be a powder (or powder mixture) or a molded body.

In a preferred embodiment, the easily oxidizable material is composed of, for example, one or more metals selected from the group consisting of alkali metals and alkali earth metals, or the alloy thereof. As such metals, sodium, lithium, calcium, strontium and barium are particularly preferred, and sodium is most preferred.

As the material other than the easily oxidizable material to be added to the raw material mixture, gallium, aluminum, indium, boron and tin can be given.

As a dopant, a small amount of impurity elements can be added. For example, silicon can be added as n-type dopant.

By the growing method according to the present invention, for example, the following single crystals can be suitably grown: GaN, AlN, InN, the mixed crystal thereof (AlGaInN), and BN The easily oxidizable material may behave as a reactant in a predetermined reaction such as promotion of dissociation of nitrogen, or may exist as one unreactive component in the growth solution.

The heating temperature and pressure in the single crystal growing process can be selected depending on the kind of single crystal to be grown without particular limitation. The heating temperature can be set, for example, to 800 to 1500° C. The pressure is not particularly limited either, but is preferably 1 MPa or more, further preferably 5 MPa or more. The upper limit of the pressure is not particularly regulated, but can be set, for example, to 200 MPa.

The crucible for performing the reaction can be formed of any airtight material which is durable in an intended heating and pressurizing condition without particularly limitation. Examples of such material include a high-melting point metal such as metallic tantalum, tungsten or molybdenum, an oxide such as alumina, sapphire or yttria, a nitride ceramics such as aluminum nitride, titanium nitride, zirconium nitride or boron nitride, a carbide of high-melting point metal such as tungsten carbide or tantalum carbide, and a thermal decomposition product such as p-BN (pyrolytic BN) or p-Gr (pyrolytic graphite).

Further concrete single crystals and growing procedures thereof will be then exemplified.

(Growth Example of Gallium Nitride Single Crystal)

The present invention can be used to grow gallium nitride single crystals using a growth solution containing at least sodium metal. A gallium raw material is mixed to the growth solution. As the gallium raw material, gallium single metal, a gallium alloy or a gallium compound are applicable, and gallium single metal is suitably used from the viewpoint of handling.

The growth solution may include a metal other than sodium e.g. lithium. Although the gallium raw material and the growth solution raw material such as sodium may be used in an appropriate proportion, excess use of Na is generally considered. This is, of course, not limitative.

In this embodiment, the growth of gallium single crystals is carried out in an atmosphere consisting of mixed gas containing nitrogen gas under a total pressure ranging from 300 atm to 2000 atm. By setting the total pressure to 300 atm or more, gallium single crystals of good quality could be grown, for example, in a high-temperature range of 900° C. or higher, more preferably 950° C. or higher. This reason is not known exactly but is assumed to be attributable to that the nitrogen solubility is increased according to temperature rise to promote efficient dissolution of nitrogen to the growth solution. When the total pressure of the atmosphere exceeds 2000 atm, the density of the high-pressure gas rather gets close to that of the growth solution, so that it becomes difficult to retain the growth solution within the growth vessel.

TABLE 1

Densities of various materials (g/cm³)

| | Sodium metal | Nitrogen | Argon |
| --- | --- | --- | --- |
| 800° C. · 1 atm | 0.75 | 0.0003 | 0.0004 |
| 927° C. · 300 atm | | 0.08 | 0.11 |
| 927° C. · 1000 atm | | 0.21 | 0.33 |
| 927° C. · 2000 atm | | 0.3 (speculation) | 0.5 (speculation) |

In a preferred embodiment, the nitrogen partial pressure in the growing atmosphere is set to 100 atm or more and 2000 atm or less. By setting the nitrogen partial pressure to 100 atm or more, gallium nitride single crystals of good quality could be grown in a high-temperature range of, for example, 1000° C. or higher while promoting the dissolution of nitrogen in the growth solution. From this point of view, the nitrogen partial pressure in the atmosphere is set further preferably to 200 atm or more. The nitrogen partial pressure is set also preferably to 1000 atm or less from the practical point of view.

Although the gas other than nitrogen in the atmosphere is not particularly limited, inert gas is preferred, and argon, helium or neon is particularly preferred. The partial pressure of the gas other than nitrogen corresponds to a value obtained by subtracting the nitrogen partial pressure from the total pressure.

In a preferred embodiment, the growth temperature of gallium nitride single crystal is set to 950° C. or higher, further preferably to 1000° C. or higher, and even in such a high-temperature range, gallium nitride single crystals of good quality can be grown. The growth at high temperature and high pressure may probably improve the productivity.

Although the upper limit of the growth temperature of gallium nitride single crystal is not particularly limited, an excessively high growth temperature makes the crystal growth difficult. Therefore, the growth temperature is set preferably to 1500° C. or lower. From this viewpoint, the temperature is set further preferably to 1200° C. or lower.

As the material of the growth substrate for epitaxially growing the gallium nitride crystals, for example, sapphire, AlN template, GaN template, silicon single crystal, SiC single crystal, MgO single crystal, spinel ($MgAl_2O_4$), $LiAlO_2$, $LiGaO_2$ and perovskite composite oxide such as $LaAlO_3$, $LaGaO_3$ or $NdGaO_3$ can be given, although the material is not particularly limited thereto. A cubic perovskite composite oxide represented by the composition formula $[A_{1-y}(Sr_{1-x}Ba_x)_y][(Al_{1-z}Ga_z)_{1-u}D_u]O_3$ (where A is a rare earth element; D is one or more elements selected from the group consisting of niobium and tantalum; y=0.3 to 0.98; x=0 to 1; z=0 to 1; u=0.15 to 0.49; and x+z=0.1 to 2) is also usable. Further, SCAM ($ScAlMgO_4$) is also usable.

(Growth Example of AlN Single Crystal)

The present invention could be confirmed to be effective for growth of AlN single crystals by pressurizing a melt including a growth solution containing at least aluminum and alkali earth metal in a nitrogenous atmosphere under a specific condition.

EXAMPLES

Example 1

Growth of GaN crystal on a seed crystal substrate 6 was carried out in such a manner as schematically shown in FIGS. 1 and 2. Concretely metal Na 30 g, metal Ga 20 g, and metal Li 30 mg were weighed within a glove box. These raw materials were charged in an alumina-made crucible 1 with inner diameter of 70 mm. As the seed crystal 6, an AlN template substrate, GaN template substrate or free-standing GaN single crystal substrate with 2 inch diameter was used. The substrate was horizontally placed on the bottom of the crucible 1 so that the single crystal thin film of the template was upward, or the Ga surface of the free-standing GaN single crystal substrate was upward. The AlN template substrate is a substrate obtained by epitaxially growing an AlN single crystal thin film on a sapphire substrate in a thickness of 1 micron, and the GaN template substrate is a substrate obtained by epitaxially growing a GaN single crystal thin film on a sapphire substrate in a thickness of 3 microns.

The crucible 1 was then disposed within an outer container 4 of φ80 mm in diameter with holes, and steel wool 15 was arranged in the circumference of the crucible 1. The weight of the steel wool was about 5 g. The outer container 4 with holes was sealed by lids 4a, taken out of the glove box, and disposed within a stainless (SUS 310S)-made atmospheric control container 5 with φ200. Steel wool 14 was also arranged in the circumference of the outer container 4 with holes. The stainless-made atmospheric control container 5 was disposed within a pressure vessel 12 of a growth apparatus.

After the pressure vessel 12 was evacuated to vacuum by a vacuum pump for removing the atmosphere within the vessel, gas substitution was performed using nitrogen gas several times, and the pressure vessel was raised in temperature and pressure to 900° C. and 50 atm over one hour, and then retained at 900° C. for 100 hours. After naturally allowed to cool to room temperature, the crucible was taken out of the growth apparatus, and treated with ethanol to thereby dissolve Na and Li. Thereafter, the remaining Ga was removed by dipping in diluted hydrochloric acid to take out the resulting GaN single crystal. The GaN single crystal had a substantially circular shape with a grain size of φ2 inches and a thickness of about 3 mm. The crystal was substantially colorless and transparent. As a result of impurity analysis of the resulting crystal by EPMA (electron probe microanalysis), no oxygen was detected.

Comparative Example 1

The same experiment as in Example 1 was carried out without arrangement of the steel wools 15 and 14. The resulting GaN crystal had a brownish-red to black color although it transmitted light, and was not colorless and transparent. As a result of the same impurity analysis of this crystal, oxygen was detected, and intake of oxygen to the crystal was proved.

While specific preferred embodiments have been shown and described, the present invention is never limited by these specific embodiments, and can be carried out with various modifications and substitutions without departing from the scope of the claims of the present invention.

The invention claimed is:

1. A method for producing a nitride single crystal using a growth solution containing an easily oxidizable material, the method comprising the use of:
   a crucible for storing the growth solution,
   a pressure vessel for storing the crucible and charging an atmosphere containing at least nitrogen, and
   an oxygen absorber disposed inside the pressure vessel and outside the crucible to grow the nitride single crystal, the oxygen absorber comprising metallic wool.

2. The method for producing a nitride single crystal of claim 1, further comprising the use of an outer container provided inside the pressure vessel to store the crucible, wherein the oxygen absorber is provided inside the outer container.

* * * * *